(12) United States Patent
Kouassi et al.

(10) Patent No.: US 12,432,991 B2
(45) Date of Patent: Sep. 30, 2025

(54) BACK-GATE EFFECT CONTROL VIA DOPING

(71) Applicant: Murata Manufacturing Co., Ltd., Nagaokakyo (JP)

(72) Inventors: Kouassi Sebastien Kouassi, San Diego, CA (US); Sinan Goktepeli, San Diego, CA (US); Simon Edward Willard, San Diego, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 18/922,186

(22) Filed: Oct. 21, 2024

(65) Prior Publication Data

US 2025/0048691 A1   Feb. 6, 2025

Related U.S. Application Data

(63) Continuation of application No. PCT/US2023/019395, filed on Apr. 21, 2023.

(Continued)

(51) Int. Cl.
 *H10D 62/10*   (2025.01)
 *H01L 21/762*   (2006.01)
 *H10D 84/80*   (2025.01)

(52) U.S. Cl.
 CPC ..... *H10D 62/125* (2025.01); *H01L 21/76267* (2013.01); *H01L 21/76283* (2013.01); *H10D 84/811* (2025.01)

(58) Field of Classification Search
 CPC .. H10D 61/125; H10D 84/811; H10D 84/817; H10D 84/0151; H10D 84/038;
 (Continued)

(56) References Cited

U.S. PATENT DOCUMENTS

2017/0170177 A1* 6/2017 Tasbas ............... H10D 84/0151
2019/0057868 A1   2/2019 Englekirk et al.
(Continued)

OTHER PUBLICATIONS

International Search Report and Written Opinion for PCT/US2023/019395 filed on Apr. 21, 2023 on behalf of Psemi Corporation Mail Date: Jul. 24, 2023 11 pages.
(Continued)

*Primary Examiner* — Latanya N Crawford Eason
(74) *Attorney, Agent, or Firm* — Steinfl + Bruno LLP (57) ABSTRACT

Methods and structures for mitigating back-gate effects in a radio frequency (RF) silicon-on-insulator (SOI) substrate, RF-SOI, are presented. According to one aspect, a first implant or junction is formed in a region of a trap-rich layer (TRL) of the RF-SOI that is located below a first circuit/device to protect. The first implant or junction is fully contained within the TRL. A planar surface area of the first implant and/or junction fully contains a projection of a planar surface area of the first circuit and/or device. The first implant or junction is biased via a through BOX contact (TBC) that penetrates the BOX layer at a shallow trench isolation region formed in the RF-SOI. According to another aspect, a second implant or junction is formed in a region of the TRL below a second circuit/device. The first and second implants or junctions are disjoint and separated by an undoped region of the TRL.

19 Claims, 9 Drawing Sheets

Related U.S. Application Data (60) Provisional application No. 63/336,920, filed on Apr. 29, 2022.

(58) Field of Classification Search
CPC ............. H10D 84/0153; H10D 62/113; H10D 62/114; H10D 62/123; H10D 62/124; H10D 62/125; H10D 84/813; H10D 84/911; H01L 21/76267; H01L 21/76283
See application file for complete search history.

(56) References Cited

U.S. PATENT DOCUMENTS

| | | |
|---|---|---|
| 2021/0217849 A1 | 7/2021 | Jain et al. |
| 2022/0123118 A1* | 4/2022 | Yang ..................... H01L 21/761 |

OTHER PUBLICATIONS

Li X. et al., "Suppression of the Backgating Effect of Enhancement-Mode p-GaN HEMTs on 200-mm GaN-on-SOI for Monolithic Integration" *IEEE Electron Device Letters,* vol. 39, No. 7, Jul. 2018, pp. 999-1002.

* cited by examiner

BACK-GATE EFFECT CONTROL VIA DOPING

CROSS-REFERENCE TO RELATED APPLICATIONS

The present application a continuation of International Application No. PCT/US2023/019395 filed on Apr. 21, 2023, which, in turn, claims priority to U.S. Provisional Patent Application No. 63/336,920, filed on Apr. 29, 2022, for "BACK-GATE EFFECT CONTROL VIA DOPING," the contents of all of which are incorporated herein by reference in their entirety.

FIELD

The present disclosure is related to semiconductor technology, and more particularly to methods and structures for back-gate mitigation in a radio frequency (RF) silicon-on-insulator (SOI) substrate via implantation of dopant.

BACKGROUND

Figure 1A:
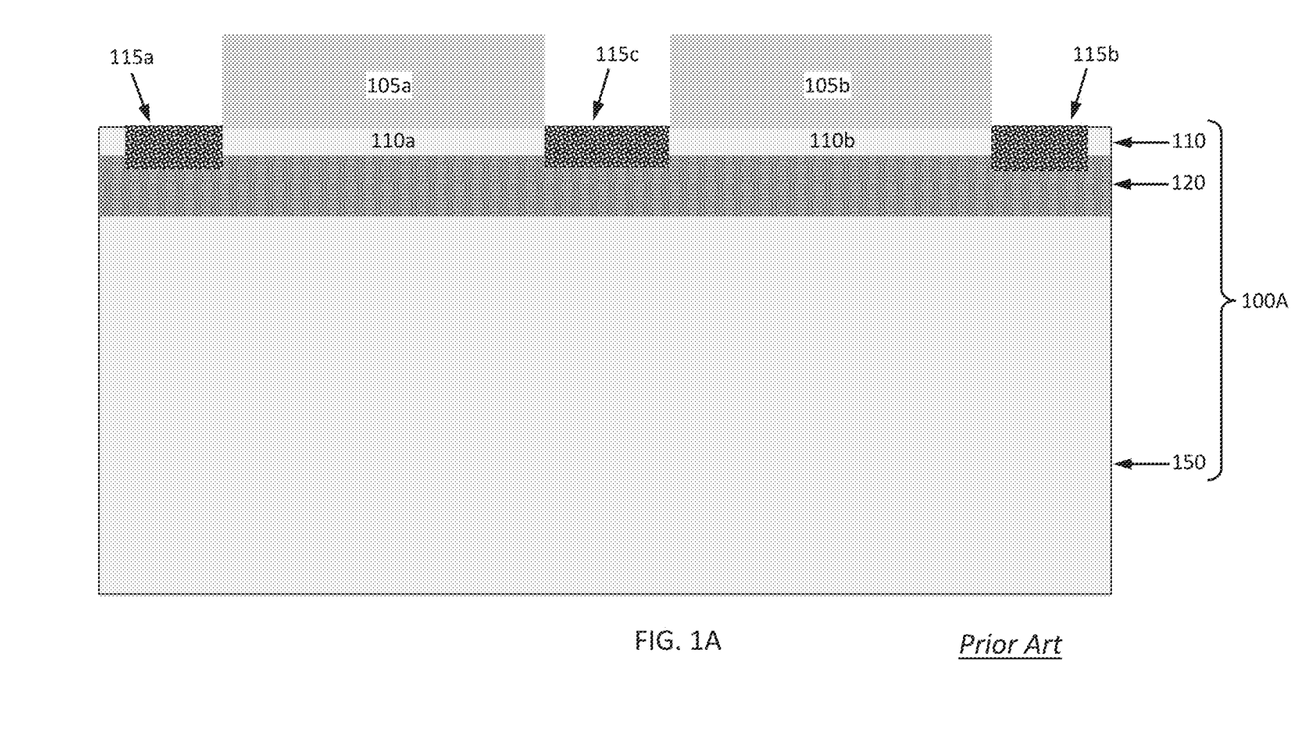
FIG. 1A shows a cross-sectional view of two circuits formed on a prior art silicon-on-insulator (SOI) substrate.

FIG. 1A shows a cross-sectional view of a SOI substrate (100A) that includes a bulk (silicon) substrate (150) over which a thin layer of silicon (Si, 110, also referred to as SOI layer) overlying an insulating BOX layer (120, e.g., $SiO_2$) is formed. Circuits (also known as SOI circuits) that include devices (e.g., SOI transistors) may be formed in and above the thin layer of silicon (110) by methods and techniques that are well-known in the art. For example, FIG. 1A shows two circuits (105a, 110a) and (105b, 110b) formed in and above respective thin silicon regions (110a) and (110b) of the thin layer of silicon (110), such regions isolated from one another, and other circuits, via one or more shallow trench isolation (STI) regions (e.g., 115a, 115b, 115c). In some cases, the circuits (105a, 110a) and/or (105b, 110b) may include RF devices (e.g., transistors) whose performances may be affected by the well-known in the art parasitic surface conduction (PSC) effect at the interface between the BOX layer (120) and the bulk substrate (150) that is due to the capacitor-like configuration a SOI stack creates. As known to a person skilled in the art, PSC may be due to fixed positive charges within the BOX layer (120) near the interface with the bulk substrate (150) attracting free (charge) carriers and thereby reducing effective resistivity of the bulk substrate (150) and resulting in increased loss and nonlinearity. Provision of a trap-rich layer (130) between the BOX layer and the bulk substrate (150) as shown in the cross-sectional view of the SOI substrate (100B) of FIG. 1B, also known as a RF-SOI substrate by virtue of presence of the trap-rich layer (130) and a high-resistivity (HR-Si) bulk substrate (150), may reduce the PSC effect and therefore increase performance of the RF devices. As known to a person skilled in the art, presence of the trap-rich layer (130) may produce a trap-rich effect that includes trapping of free charges (e.g., electrons, carriers) underneath the BOX layer (120), thereby preventing flow of current that may produce undesired coupling of signals to/between the RF devices formed in the thin layer of silicon (110).

Figure 1B:
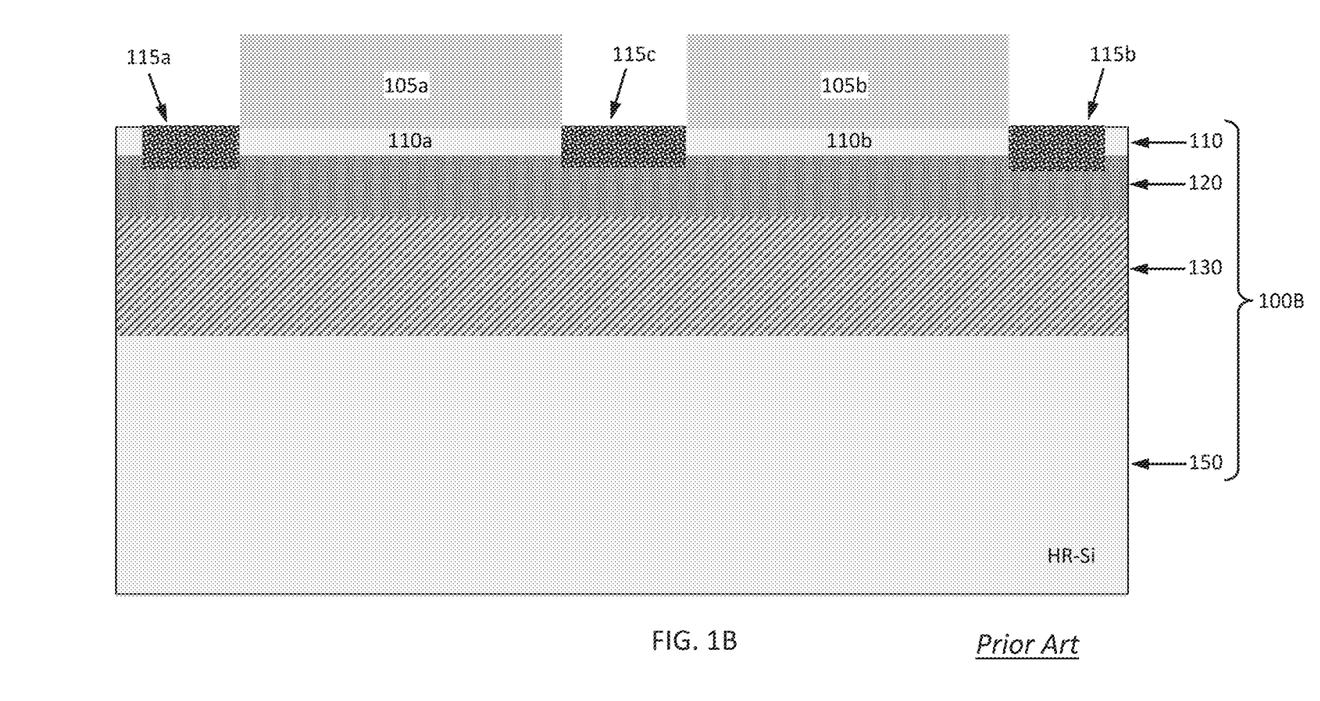
FIG. 1B shows a cross-sectional view of two circuits formed on a prior art radio frequency (RF) SOI (RF-SOI) substrate comprising a high resistivity substrate and a trap-rich layer.

In some cases, one or more of the two circuits (105a, 110a) or (105b, 110b) shown in FIG. 1B may operate over high voltages and/or include switching devices/transistors that may be used to switch in and out relatively high voltages at different periods of time (e.g., asynchronously). Such high voltages may induce electric fields in the BOX layer (120) and the trap-rich layer (130) of FIG. 1B which may couple (e.g., capacitively) to the bulk substrate (150). As a consequence, and as known to a person skilled in the art, the bulk substrate (150) may effectively operate like a parasitic gate electrode, commonly called a "back-gate", which may affect the overall performance of the devices/transistors of the circuits (105, 110a) and/or (105b, 110b). As known to a person skilled in the art, effects of such back-gate, may include, for example, impact on a leakage current of a transistor formed in the thin layer of silicon (110), shift of a threshold voltage of the transistor, and/or turning ON or OFF the so-called "back channel" of the transistor.

Teachings according to the present disclosure describe methods and structures to mitigate/reduce effects of the back-gate in circuits and/or devices formed on a RF-SOI substrate similar to the RF-SOI substrate (100B) of FIG. 1B.

SUMMARY

According to a first aspect of the present disclosure, a silicon on insulator (SOI) structure is presented, the structure comprising: an RF-SOI substrate, the RF-SOI substrate comprising a high resistivity silicon (HR-Si) substrate; a trap-rich layer overlying the HR-Si substrate; a buried oxide (BOX) layer overlying the trap-rich layer; and a thin silicon layer overlying the BOX layer; a first circuit formed in a first silicon region of the thin silicon layer; and a first implant in a region of the trap-rich layer that is immediately below the first circuit, wherein the first implant is configured to be biased with a first voltage that is based on an operating state of the first circuit.

According to a second aspect, a method for reducing back-gate effects in a silicon-on-insulator (SOI) circuit is presented, the method comprising: doping a region of a trap-rich layer that is immediately below the SOI circuit; based on the doping, reducing a resistivity of said region, thereby increasing a charge transfer rate of said region; and biasing said region with a voltage that is based on an operating state of the SOI circuit, thereby reducing the back-gate effects in the SOI circuit, wherein the SOI circuit is formed on an RF-SOI substrate that comprises: a high resistivity silicon (HR-Si) substrate; the trap-rich layer overlying the HR-Si substrate; a buried oxide (BOX) layer overlying the trap-rich layer; and a thin silicon layer overlying the BOX layer.

Further aspects of the disclosure are provided in the description, drawings and claims of the present application.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Teachings according to the present disclosure allow mitigating of the back-gate effect produced in the substrate (100B) of FIG. 1B by forming implant regions and/or junction regions in regions of the trap-rich layer (130) immediately below the circuits (105a, 110a) and/or (105b, 110b). In other words, the implant and/or junction regions according to the present disclosure may be formed by n-type and/or p-type doping of the regions of the trap-rich layer (130) immediately below the circuits (105a, 110a) and/or (105b, 110b).

The respective implant and/or junction regions according to the present disclosure may be fully contained/encompassed within the trap-rich layer (130). The respective implant and/or junction regions according to the present disclosure may be (laterally) separated by an undoped region of the trap-rich layer (130). Such undoped regions of the trap-rich layer (130) may contribute to increased electrical isolation between the respective implant and/or junction regions due to the inherent characteristics of the trap-rich layer (130) that prevents (e.g., substantially reduces) electron/carrier mobility (e.g., via a sufficiently high density of traps). The respective implant and/or junction regions according to the present disclosure may be separated from the HR-Si bulk substrate (150) by an undoped region of the trap-rich layer (130).

A junction region according to the present disclosure may include a n+/p− type junction or a p+/n− type junction. Other embodiments and case use may include any combination of lightly and/or heavily doped first type implant and an opposite type implant that may form a junction interface. A type of junction may be based on a type of circuit and/or devices (e.g., polarity of a device such as for example N-MOS or P-MOS transistor) targeted for protection against the back-gate effect, and/or on a polarity (e.g., positive or negative with respect to a reference potential) of a (high) voltage applied to the circuit and/or devices. According to an embodiment of the present disclosure, the junction region includes an interface between two implant regions of opposite polarities (n-type vs. p-type). According to an embodiment of the present disclosure, one of the two implant regions is formed in a well provided by the other implant region. In other words, one of the two implant regions targets a first depth range into the trap-rich layer (130) that is proximate the BOX layer (120) and the other implant region targets a second depth range that is deeper than the first depth range (and therefore distal the BOX layer 120). Accordingly, the second implant region surrounds the first implant region, at least within the trap-rich layer (130).

According to an embodiment of the present disclosure, the implant and/or junction regions may be biased independently from one another to control a potential at the regions of the trap-rich layer (130) immediately below said circuits. Biasing of the implant and/or junction regions according to the present disclosure may be provided by respective one or more through BOX contacts (TBCs) that resistively couple respective biasing signals/voltages to the respective implant and/or junction regions. Such independent biasing may allow to improve performances of the respective circuits/devices by removing/reducing corresponding back-gate effects. Improving performance may include, for example, improving an ON-state conduction performance of a device in a first circuit while simultaneously improving/reducing an OFF-state current leakage of a device in a second circuit.

Teachings according to the present disclosure may apply to any RF-SOI substrate that included stacked layers (110, 120, 130, 150 of FIG. 1B), wherein the bulk substrate (150) is a high-resistivity substrate (HR-Si) with a resistivity that is higher/greater than 200 Ohm·cm (e.g., typical resistivity values of 1000's of Ohm·cm). Teachings according to the present disclosure may equally apply to a deposited or to an implanted trap-rich layer (130). A deposited trap-rich layer (130) may include, for example, a layer of polycrystalline material, such as for example, polysilicon, that can provide a sufficiently high (areal) density of traps. An implanted trap-rich layer (130) may include, for example, a layer formed in the bulk substrate (150) or in a prefabricated SOI substrate (e.g., 100A of FIG. 1A wherein 150 is HR-Si) by implantation of (trap) species (e.g., carbon, germanium, fluorine, xenon, neon) penetrating the bulk substrate (150) or a layered (crystalline) structure of the prefabricated SOI substrate, that can equally provide the sufficiently high density of traps. The goal of such implantation is to create a sufficiently damaged layer, or an amorphous layer (e.g., devoid of a crystalline structure), in the silicon immediately below the BOX layer (e.g., 120 of FIG. 1B) that contains the sufficiently high density of traps.

As used herein, a trap-rich layer (e.g., 130) may be characterized by its "trap density", or areal density of traps, measured in atoms per cm-square (at/cm$^2$). A trap-rich layer according to the present disclosure has a (purposely, specifically, deliberately induced) trap density that is greater than 1×E8 at/cm$^2$ (i.e., $10^8$ at/cm$^2$). As known to a person skilled in the art, typical state of the art trap-rich layers may have a trap density that is as high as about 1×E11 at/cm$^2$. A trap density that is greater than 1×E8 at/cm$^2$ is therefore sufficiently high to allow the trap-rich layer (e.g., 130 of FIG. 1B) to trap the above-described free charges (e.g., electrons, carriers) and thus reduce/eliminate the PSC effect underneath of the BOX layer (120). In other words, traps in the trap-rich layer may cause the free carrier charges in the substrate to no longer flow to produce a current as they may without the traps.

It should be noted that although a monocrystalline (e.g., Si) bulk substrate, such as for example the HR-Si bulk substrate (150) of FIG. 1B, may have inherent defects/impurities that can be likened to traps, areal density of such defects may be orders of magnitude smaller than the specified trap density of 1×E8 at/cm$^2$ of a trap-rich layer/region/material. In order to maintain its desired semiconductor properties, a bulk substrate, including a HR-Si bulk substrate (e.g., 150 of FIG. 1B), must allow flow of carrier charges. Accordingly, (inherent) typical defects/impurities in such substrates may have an areal density of about 1×E6 at/cm$^2$ or less, or in other words, at least two orders of magnitude smaller than the areal density of a trap-rich layer (e.g., 130 of FIG. 1B). It follows that although the HR-Si bulk substrate (150) and the trap-rich layer (130) of FIG. 1B may have similar resistivities (e.g., greater than 200 Ohm·cm), they can be clearly differentiated by, for example, their respective trap densities.

Figure 2A:
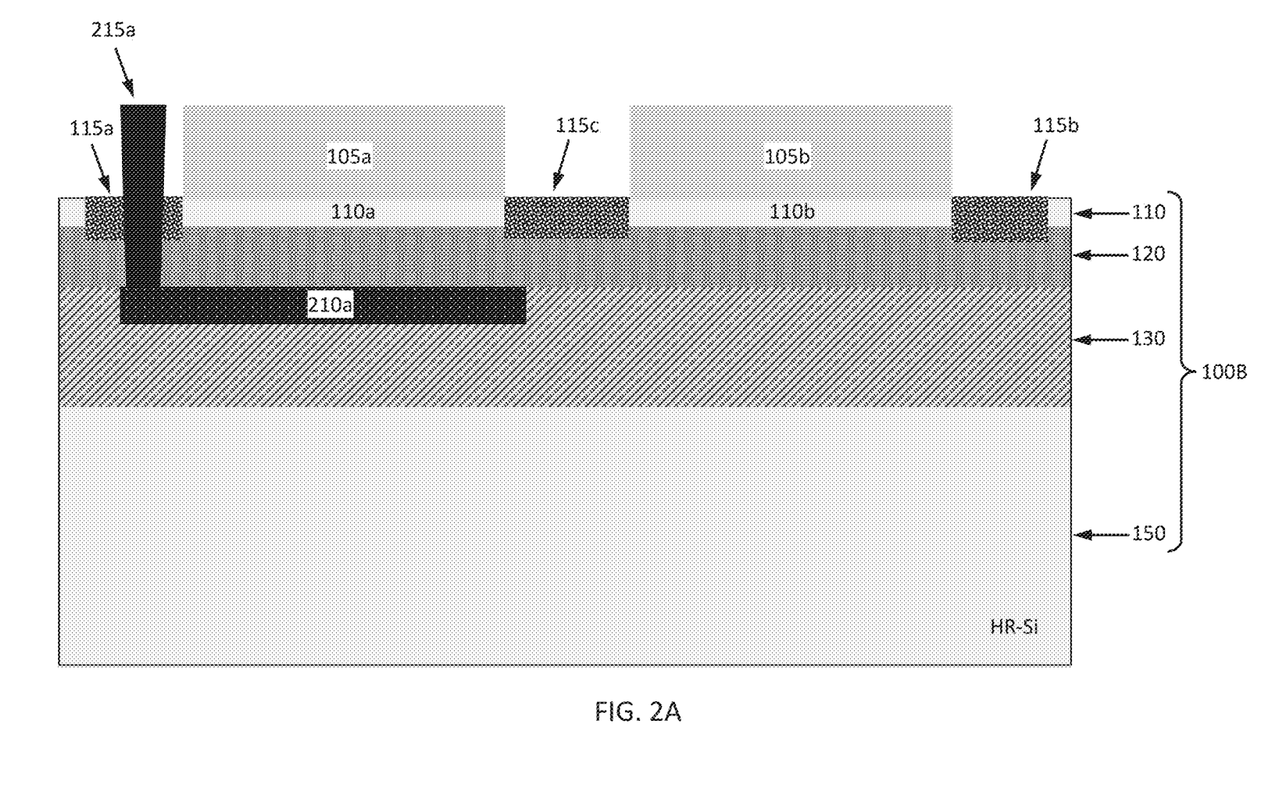
FIG. 2A shows a cross-sectional view of two circuits formed on a RF-SOI substrate comprising an implant formed in a region of the trap-rich layer according to an embodiment of the present disclosure.

FIG. 2A shows a cross-sectional view of two circuits (105a, 110a) and (105b, 110b) formed on a RF-SOI substrate (100B) comprising an implant region (210a) formed in the trap-rich layer (130) according to an embodiment of the present disclosure. Furthermore, as shown in FIG. 2A, a through BOX contact (215a, TBC) may be used to provide (e.g., resistively couple) a biasing signal/voltage to the implant region (210a). A person skilled in the art will clearly realize that FIG. 2A shows the configuration described above with reference to FIG. 1B with the added implant region (210a) and the TBC (215a) according to the present teachings. Furthermore, a person skilled in the art will clearly be familiar with methods and techniques related to the fabrication/formation of the implant region (210a) (e.g., doping) and the TBC (215a) (e.g., stacked metal via through the BOX layer), which methods and techniques are outside the scope of the present disclosure.

With continued reference to FIG. 2A, according to an embodiment of the present disclosure, the implant region (210a) may be of n+ type or may be of p+ type. According to some exemplary embodiments of the present disclosure, a type of the implant may be based on a polarity of a voltage and/or a target transistor (to be protected) of the circuit (105a, 110a). In some embodiments, biasing of the implant region (210a) via a biasing voltage applied through the TBC (215a) may aim at reducing a difference between a voltage in a silicon region (110a) of the circuit (105a, 110a) and a voltage at a (doped) region of the trap-rich layer (130) that is immediately below the circuit (105a, 110a). In other words, the biasing voltage applied through the TBC (215a) may not be static, rather change with an operating state (e.g., voltage) of the circuit (105a, 110a), the operating state characterized, for example, by a voltage of said circuit. Other embodiments may include n or p type or even n− or p− type dopants for the implant region (210a).

With further reference to FIG. 2A, according to an embodiment of the present disclosure, the doped region of the trap-rich layer (130) that forms the implant region (210a) may be selected to extend in a plane (perpendicular to observer's view of FIG. 2A) that includes an entirety of a projection of the circuit (105a, 110a) onto said plane. In other words, according to an embodiment of the present disclosure, the doped region of the trap-rich layer (130) that forms the implant region (210a) has a surface that covers an entirety of a footprint of the circuit (105a, 110a) above it. This is further described/clarified with reference to FIG. 2C later described.

As shown in FIG. 2A, according to an embodiment of the present disclosure, the TBC (215a) may penetrate the BOX layer (120) through an STI region (115a) that defines a boundary of the thin silicon region (110a) of the circuit (105a, 110a). As known to a person skilled in the art, different circuits on a substrate, such as circuits (105a, 110a) and (105b, 110b) formed on the RF-SOI substrate (100B), may be isolated from one another via STI regions (e.g., 115a, 115b, 115c). For example, as shown in FIG. 2A, STI region (115c) isolates the thin silicon region (110a) of the circuit (105a, 110a) from the thin silicon region (110b) of the circuit (105b, 110b). Furthermore, the STI regions (115a) and (115b) may respectively isolate the thin silicon regions (110a) and (110b) from other circuits that may be formed (not shown in FIG. 2A) on the RF-SOI substrate (100B). Accordingly, one may consider each of the circuits (105a, 110a) and (105b, 110b) as isolated from surrounding circuits via a wall of STI regions that may effectively form isolated islands of thin silicon regions (e.g., 110a, 110b, etc.). Accordingly, the TBC (215a) may penetrate through any one of the STI regions surrounding the thin silicon region (110a), including, for example, the STI region (115c) to reach and make (resistive) contact with the implant region (210a). Therefore, as shown in FIG. 2A, a lateral extension of the implant region (210a) may reach regions of the trap-rich layer (130) that are arranged below the STI regions (e.g., 115a, 155c) that define the isolated island of thin silicon region (110a) of the circuit (105a, 110a). It should be noted that in some embodiments any one or more of the STI regions (115a, 115b, 115c) may penetrate through the BOX layer (120) to make contact with, or further penetrate, the trap-rich layer (130). In a case where the STI region (115c) may penetrate through the trap-rich layer (130) and through the depth of the implant regions (210a, 210b), increased isolation between latter implant regions may be provided.

With continued reference to FIG. 2A, doping of a region (e.g., 210a) of the trap-rich layer (130) according to the present teachings may modify local electrical/semiconductor properties of that region. In particular, doping of the region (210a) may not affect carrier mobility of the region when compared to an undoped region of the trap-rich layer (130), rather, doping may increase carrier density of the region (210a), and therefore reduce resistivity of said region (e.g., to less than 200 Ohm·cm). As charge transfer performance (e.g., charge transfer rate) of a region (e.g., 210a) may be a function of its carrier mobility and its carrier density (and applied bias), the increased carrier density of the doped region (210a), and therefore the reduced resistivity of the doped region (210a), may increase charge transfer performance/rate of said region. Accordingly, for an applied bias voltage via the TBC (215a), the doped region (210a) may charge to a corresponding bias potential.

Such charging of the doped region (215a) may be at a rate (e.g., in the milliseconds, $10^{-3}$ s) that is sufficiently fast for mitigating/reducing the above-described back-gate effect. Furthermore, since the doped region (210a) is local to the trap-rich layer (130), then, as shown in FIG. 1B, it is bounded by undoped trap-rich regions that have very poor charge transfer performance (and high resistivity of greater than 200 Ohm·cm), and which therefore may control (e.g., reduce) leaking/circulating of mobile charges/currents from the doped region (210a) into a region of the trap-rich layer (130) below the circuit (105b, 110b). Accordingly, mitigating of the back-gate effect in the circuit (105a, 110a) via application of a bias signal/voltage to the doped region (210a) of the trap-rich layer (130) may not influence operation of the circuit (105b, 110b).

Figure 2B:
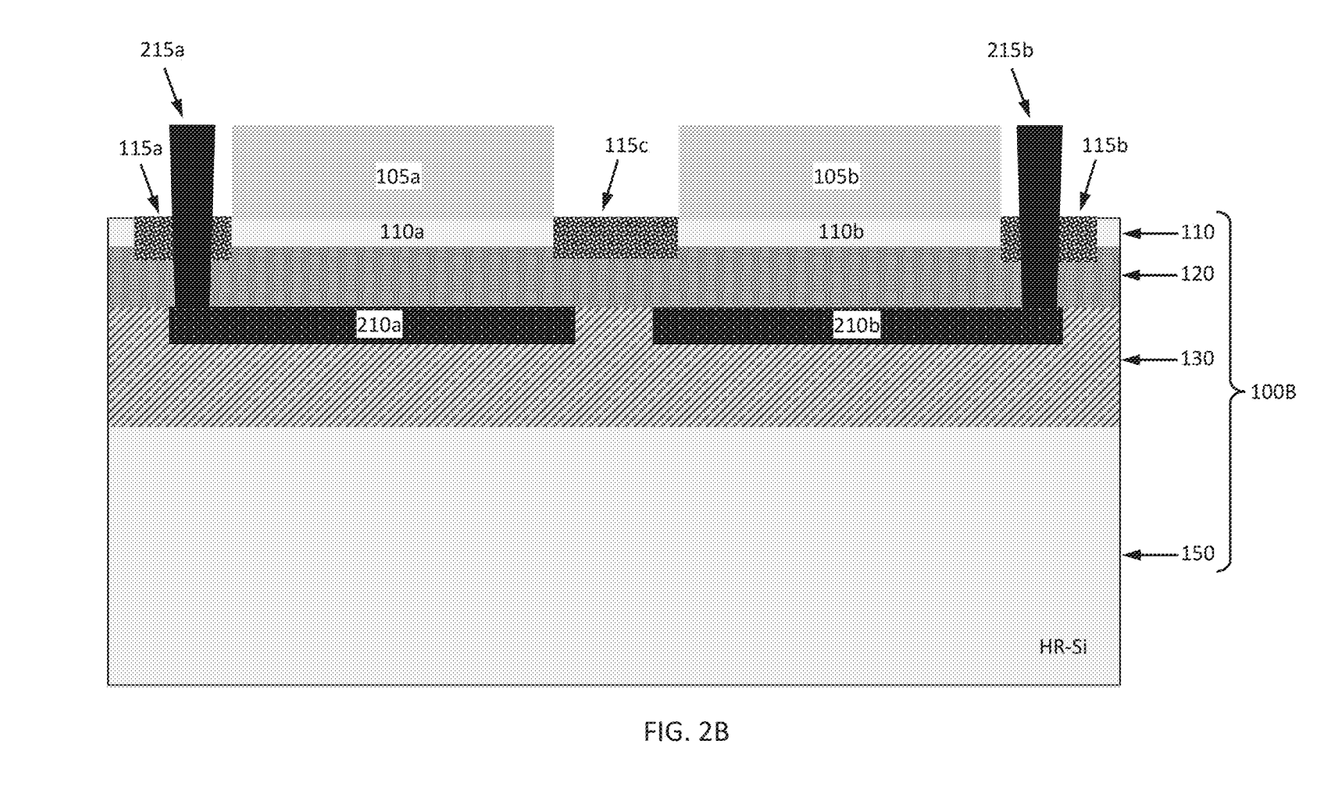
FIG. 2B shows a cross-sectional view of two circuits formed on a RF-SOI substrate comprising two implants formed in separate regions of the trap-rich layer according to an embodiment of the present disclosure.

FIG. 2B shows a cross-sectional view of two circuits (105a, 110a) and (105b, 110b) formed on a RF-SOI substrate (100B) comprising two implant regions (210a) and (210b) formed in the trap-rich layer (130) according to an embodiment of the present disclosure. Furthermore, as shown in FIG. 2B, through BOX contacts (215a) and (215b) may be used to provide (e.g., resistively couple) respective biasing signal/voltages to the implant regions (210a) and (210b). A person skilled in the art will clearly realize that FIG. 2B shows the configuration described above with reference to FIG. 2A with the added implant region (210b) and the TBC (215b, that penetrates the BOX layer 120 through a STI region 115b) for mitigating/reducing back-gate effect in the circuit (105b, 110b). Accordingly, the above description of elements (210a, 215a) for mitigating/reducing back-gate effect of the circuit (105a, 110a) may equally apply for elements (210b, 315b) for mitigating/reducing back-gate effect of the circuit (105b, 110b).

With continued reference to FIG. 2B, because the two implant regions (210a, 210b) are separated by an undoped region of the trap-rich layer (130), they may be charged/discharged independently without influencing one another. In other words, as described above, because the two doped regions (210a, 210b) are disjoint, an undoped region of the trap-rich layer (130) that exists (e.g., in the lateral direction) between the two doped regions (210a, 210b) that inherently has a very poor charge transfer performance (and high resistivity of greater than 200 Ohm·cm), may prevent leaking of mobile charges/currents from the doped region (210a) into the doped region (210b) and vice-versa. Accordingly, mitigating of the back-gate effect in either one of the circuits (105a, 110a) or (105b, 110b) may not influence operation of the other circuit.

Figure 2C:
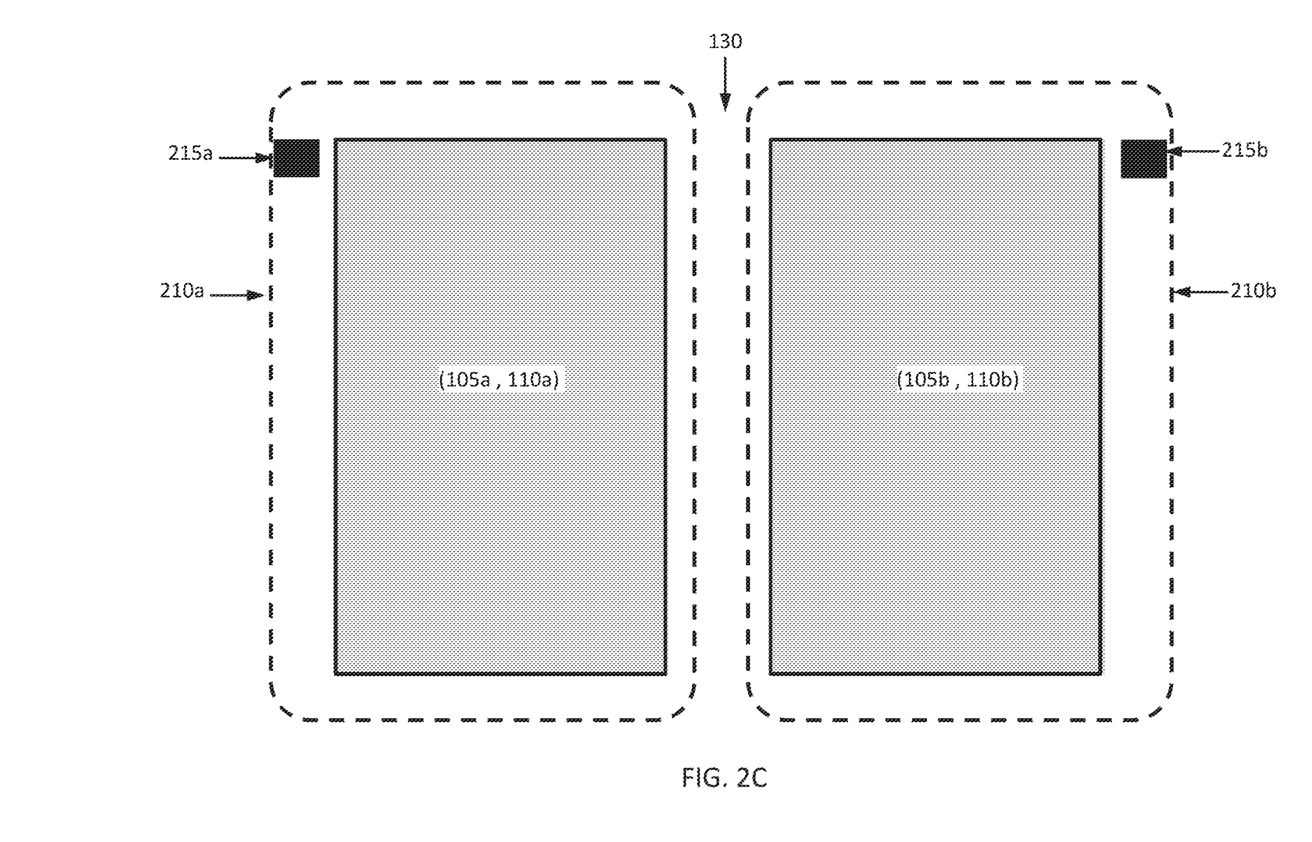
FIG. 2C shows a top planar view of the two circuits of FIG. 2B.

FIG. 2C shows a top planar view of the two circuits (105a, 110a) and (105b, 110b) described above with reference to FIG. 2B. As shown in FIG. 2C, a main planar surface/area (shown in broken lines) of each of the doped regions (210a) or (210b) fully contains/covers/encompasses a (projection of a) main planar surface/area of a corresponding circuit (105a, 110a) or (105b, 110b). Furthermore, as shown in FIG. 2C, each of the TBCs (215a) or (215b) is distanced/isolated from a corresponding circuit (105a, 110a) or (105b, 110b) by means of a corresponding STI region (e.g., 115a or 115b not shown in FIG. 2C), and (resistively) contacts a corresponding doped region (210a) or (210b). Accordingly, as described above, the two doped regions (210a) and (210b) may be charged independently via a biasing signal/voltage applied to a respective TBC (215a) and (215b). For example, during an ON state of the circuit (105a, 110a) that includes a high voltage at the circuit, a corresponding high voltage may be applied to the TBC (215a) to correspondingly charge the doped region (210a) that is below the circuit (105a, 110a) to a high potential for protecting said circuit against a back-gate effect. At the same time, the circuit (105b, 110b) may operate according to an OFF state that includes a low voltage at the circuit, and therefore a corresponding low voltage may be applied to the TBC (215b) to correspondingly charge the doped region (210b) that is below the circuit (105b, 110b) to a low potential for protecting said circuit against a back-gate effect independently from the protection of the circuit (105a, 110a).

Figure 3A:
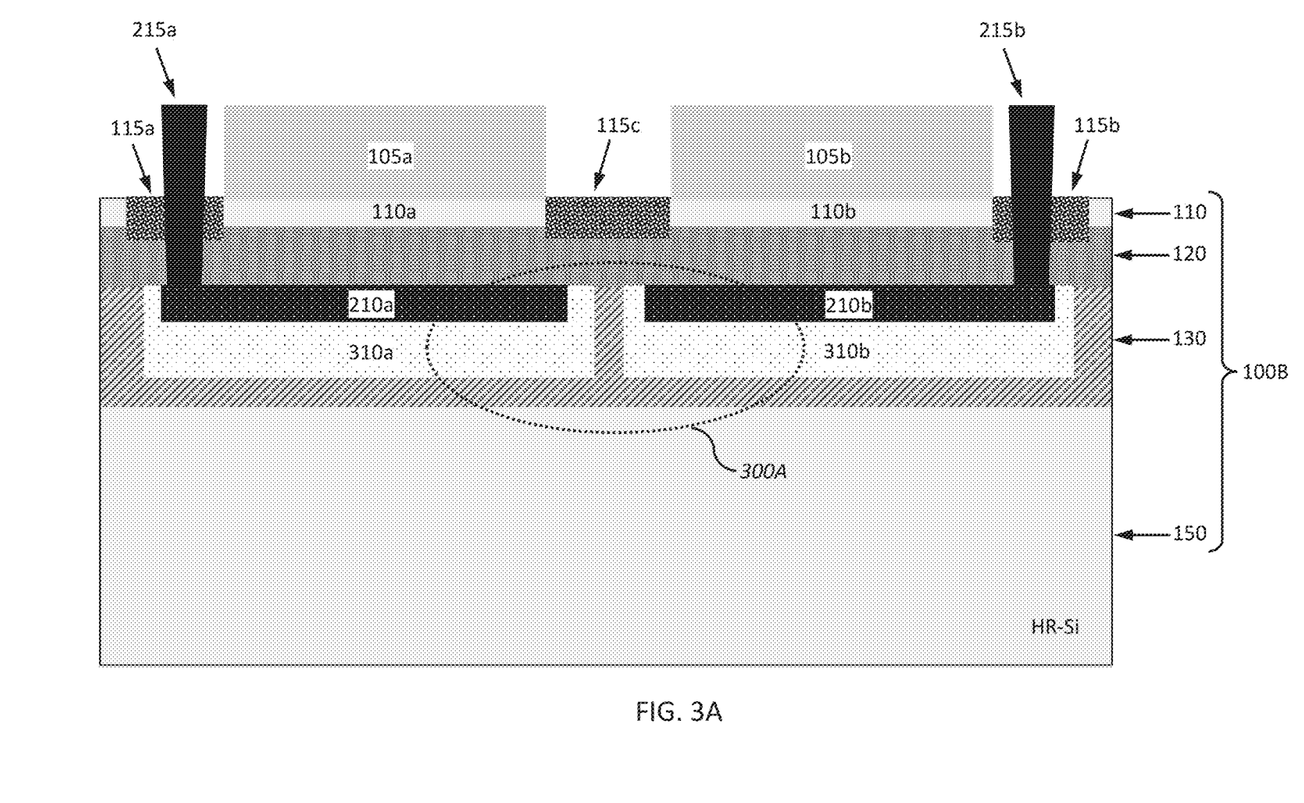
FIG. 3A shows a cross-sectional view of two circuits formed on a RF-SOI substrate comprising two junctions formed in separate regions of the trap-rich layer according to an embodiment of the present disclosure.

FIG. 3A shows a cross-sectional view of two circuits (105a, 110a) and (105b, 110b) formed on a RF-SOI substrate (100B) comprising two junction regions (210a, 310a) and (210b, 310b) formed in the trap-rich layer (130) according to an embodiment of the present disclosure. A person skilled in the art will realize that the embodiment shown in FIG. 3A is based on the embodiments described above with reference to, for example, FIG. 2B, wherein instead of doping local regions of the trap-rich layer (130) below each of the circuits (105a, 110a) and (105b, 110b) with a single dopant (e.g., n+ type or p+ type), two types of dopants are used to form respective local junction regions (210a, 310a) and (210b, 310b). For example, with reference to the junction region (210a, 310a), it may include a top doped region (210a) similar to the doped region (210a) of FIG. 2A or FIG. 2B, and a bottom and adjacent doped region (310a), wherein both doped regions (210a) and (310a) may be doped regions of the trap-rich layer (130), and therefore, fully encompassed within the trap-rich layer (130).

In particular, as shown in FIG. 3A, the top doped region (310a) may be formed in a well provided by the bottom doped region (310a) such as to form an interface region of the junction (210a, 310a). In other words, a lateral extension of the bottom doped region (310a) fully encompasses a lateral extension of the top doped region (210a). Accordingly, as shown in FIG. 3A, the top doped region (210a) is laterally bounded by the bottom doped region (310a). Accordingly, naming convention used herein, including top and bottom when applied to the doped regions (210a, 310a), may not be interpreted as excluding such lateral bounding/surrounding of the doped region (210a) by the doped region (310a), rather as including a main lateral extension/plane that is relatively arranged at the top or at the bottom as shown in FIG. 3A. Furthermore, as shown in FIG. 3A, the bottom doped region (310a) may be separated from the HR-Si bulk substrate (150) by an undoped region of the trap-rich layer (130). In other words, the junction region (210a, 310a) is fully contained within the trap-rich layer (130).

Same description above with reference to the junction region (210a, 310a) of FIG. 3A may apply to the junction region (210b, 310b) of FIG. 3A. Furthermore, as shown in FIG. 3A, the two junction regions (210a, 310a) and (210b, 310b) may be disjoint, or in other words, separated by an undoped region of the trap-rich layer (130) with benefits similar to one described above with reference to separation of the doped regions (210a) and (210b) with reference to FIG. 2B.

According to an exemplary embodiment of the present disclosure, the junction regions (210a, 310a) and (210b, 310b) may each be formed by doping adjacent local regions of the trap-rich layer (130) with dopants of opposite polarities/types and/or different doping levels. For example, according to an embodiment of the present disclosure, the doped region (210a) or (210b) may be a (heavily doped region) of n+ type whereas the doped region (310a) or (310b) may be a (lightly doped region) of p– type. According to another exemplary embodiment of the present disclosure, the doped region (210a) or (210b) may be a (heavily doped region) of p+ type whereas the doped region (310a) or (310b) may be a (lightly doped region) of n– type. Other combination of types and/or doping levels of the two doping regions that form each of the junction regions (210a, 310a) or (210b, 310b) may be possible depending on design goals and performances.

Figure 3B:
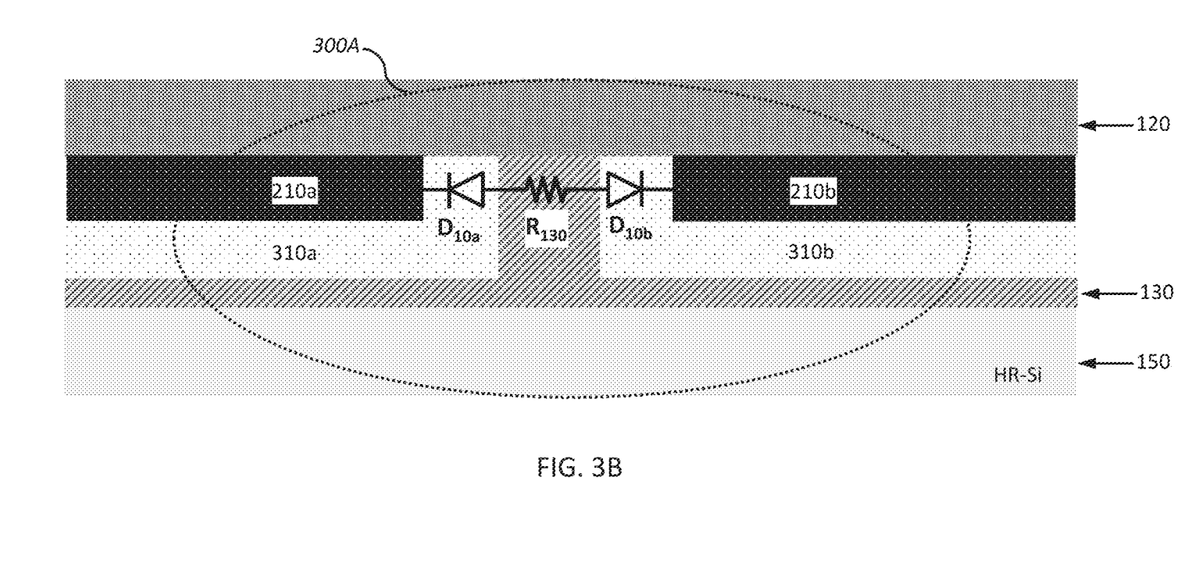
FIG. 3B shows an equivalent electric circuit of the two junction regions of FIG. 3A.

FIG. 3B shows an equivalent electric circuit ($D_{10a}$, $R_{130}$, $D_{10b}$) of the two junction regions (210a, 310a) and (210b, 310b) of FIG. 3A formed in a region annotated as (300A) in FIG. 3A. In particular, the equivalent electric circuit shown in FIG. 3B is a for an exemplary case where each of the two doped regions (210a) and (210b) are of the n+ type, and each of the two doped regions (310a) and (310b) are of the p– type. Accordingly, as shown in FIG. 3B, respective interfaces at the respective junction regions (210a, 310a) and (210b, 310b) form respective (back-to-back) diodes, $D_{10a}$ and $D_{10b}$, that are reversed, and coupled to one another via an equivalent resistance, $R_{130}$, of the undoped region of the trap-rich layer (130) that separates the junction region (210a, 310a) from the junction region (210b, 310b).

The equivalent circuit ($D_{10a}$, $R_{130}$, $D_{10b}$) of FIG. 3B clearly shows effect of the junction regions (210a, 310a) and (210b, 310b) on preventing leakage of current between the two (heavily) doped regions (210a) and (210b). At a first level, leakage of the current from any of the two doped regions (210a) and/or (210b) may be prevented/reduced via the (high) resistance, $R_{130}$, in a manner similar to one described above with reference to, for example, FIG. 2A or FIG. 2B. At a second level, leakage of the current from any of the two doped regions (210a) and/or (210b) may be further prevented/reduced via the (back-to-back) reversed diodes, $D_{10a}$ and $D_{10b}$, formed by the two junctions (210a, 310a) and (210b, 310b). Accordingly, an advantage of the embodiment of the FIG. 3A over the embodiment of FIG. 2B may be that due to the two levels of leakage prevention/reduction, a higher isolation efficiency between the two regions (210a) and (210b) may be provided when compared to the configuration of FIG. 2B. As a consequence of such improvement in isolation efficiency, the configuration of FIG. 3A may be able to operate with a trap-rich layer (130) that has a lower isolation efficiency (e.g., lower resistivity and/or lower trap density and therefore lower grade/cost) than one necessary to the configuration of FIG. 2B for a given isolation efficiency between the two doped regions (210a) and (210b).

Figure 3C:
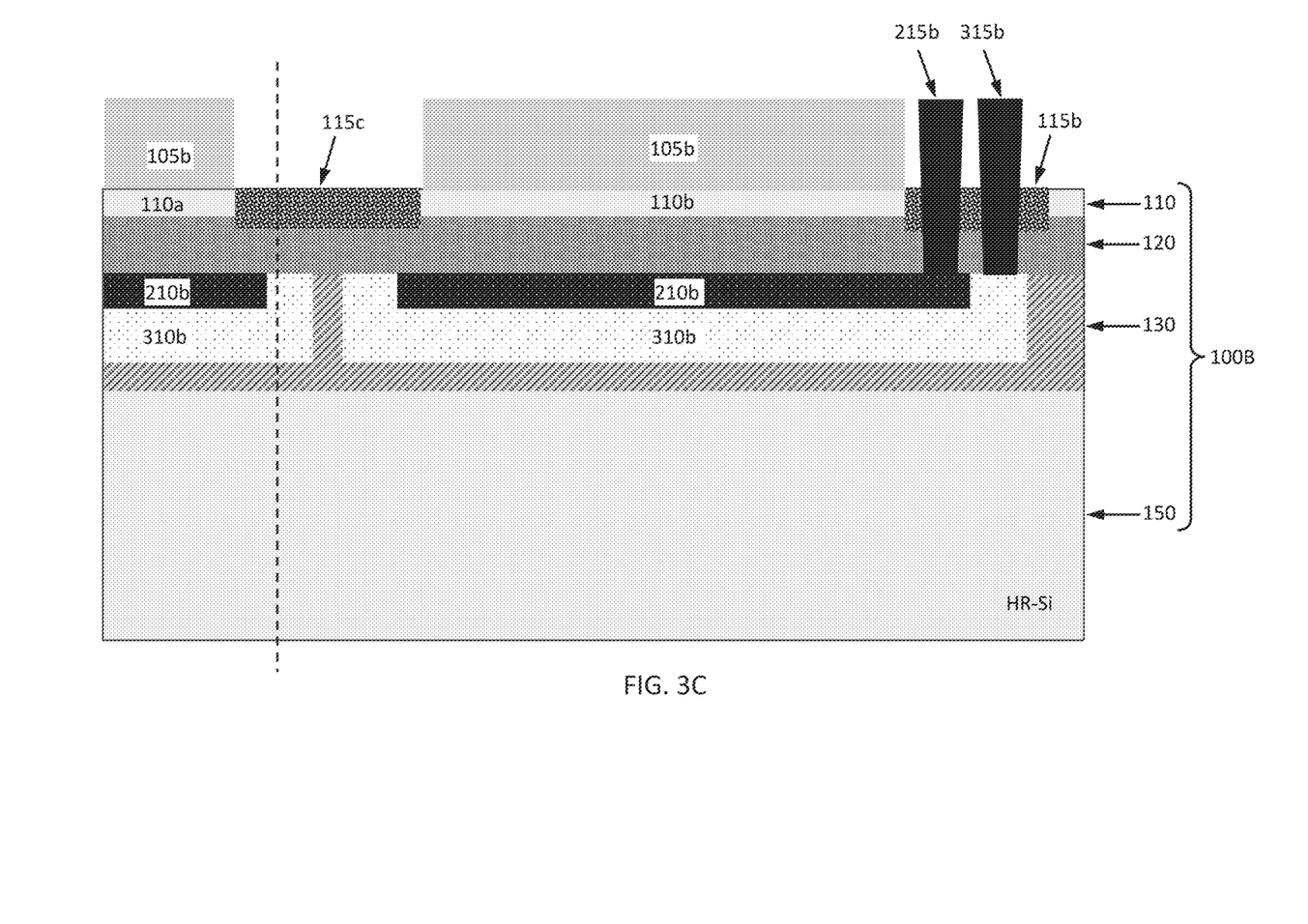
FIG. 3C shows an example for biasing of the doped region via a TBC that may also penetrate the BOX layer at the STI region.

Biasing of the junction regions (210a, 310a) and/or (210b, 310b) may include biasing of the doped regions (210a) and/or (210b) according to means (e.g., TBC 215a and/or 215b) described above with reference to, for example, FIG. 2A or FIG. 2B. Further flexibility in controlling the isolation between the two doped regions (210a) and (210b) may be provided via further biasing of the two doped regions (310a) and/or (310b). One nonlimiting exemplary embodiment according to the present disclosure is shown in FIG. 3C for biasing of the doped region (310b) via a TBC (315b) that may also penetrate the BOX layer (120) at the STI region (115b). It should be noted that the TBC (315b) may penetrate the BOX layer (120) at a different STI region, such as, for example, at the STI region (115c) or other. Biasing of the two doped regions (210b) and (310b) of the junction (210b, 310b) may allow better isolation by appropriate biasing of two terminals (anode and cathode) of the equivalent diode (e.g., $D_{10b}$ of FIG. 3B) that the junction forms. Equivalent biasing means may be provided for the doped region (310a) of FIG. 3A.

It should be noted that any of the above-described doped and/or junction regions for mitigating/reducing a back-gate effect of a (SOI) circuit formed/fabricated on a RF-SOI substrate while providing leakage isolation may coexist on the same RF-SOI substrate. In other words, not all circuits formed/fabricated on the RF-SOI substrate may be protected for back-gate effects according to the present teachings, and/or one or more of such circuits may be protected by different protection schemes, including protection via a single doped region (e.g., 210a of FIG. 2A), protection via two doped regions that form a junction region (e.g., 210a and 310a of FIG. 3A) with one doped region being biased, or protection via two doped regions that form a junction region (e.g., 210b and 310b of FIG. 3C) with both doped regions being biased.

Figure 4:
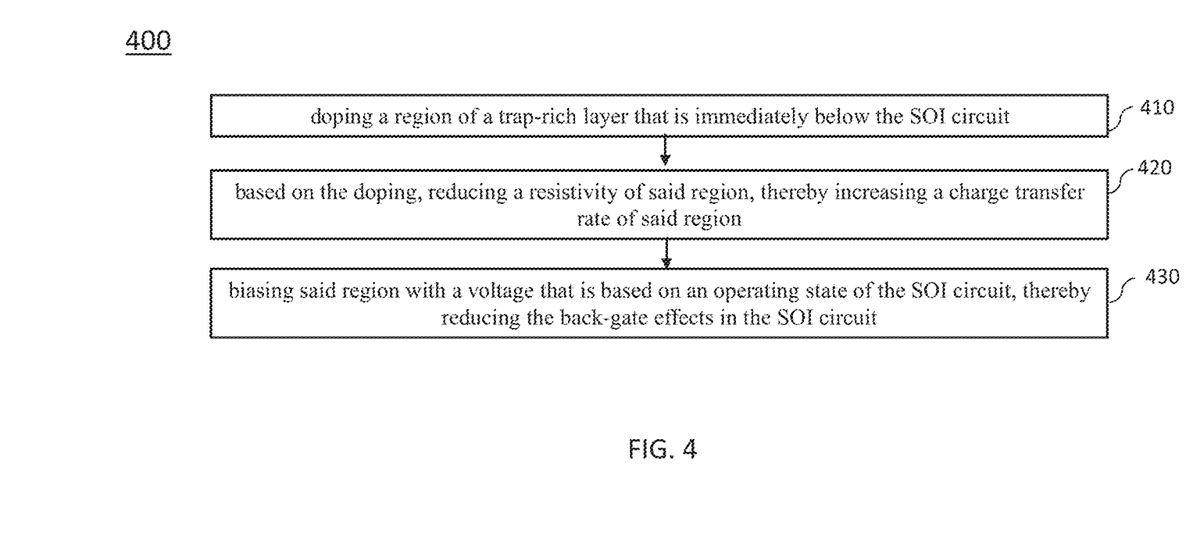
FIG. 4 is a process chart showing various steps of a method according to the present disclosure for reducing back-gate effects in a silicon-on-insulator (SOI) circuit.

FIG. 4 is a process chart (400) showing various steps of a method according to the present disclosure for reducing back-gate effects in a silicon-on-insulator (SOI) circuit. As shown in FIG. 4 such steps comprise: doping a region of a trap-rich layer that is immediately below the SOI circuit, per step (410); based on the doping, reducing a resistivity of said region, thereby increasing a charge transfer rate of said region, per step (420); and biasing said region with a voltage that is based on an operating state of the SOI circuit, thereby reducing the back-gate effects in the SOI circuit, per step (430). In such method, the SOI circuit may be formed on an RF-SOI substrate that comprises: a high resistivity silicon (HR-Si) substrate; the trap-rich layer overlying the HR-Si substrate; a buried oxide (BOX) layer overlying the trap-rich layer; and a thin silicon layer overlying the BOX layer.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, and silicon-on-insulator (SOI). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for case of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A silicon on insulator (SOI) structure, comprising:
   an RF-SOI substrate, the RF-SOI substrate comprising
      a high resistivity silicon (HR-Si) substrate;
      a trap-rich layer overlying the HR-Si substrate;
      a buried oxide (BOX) layer overlying the trap-rich layer; and
      a thin silicon layer overlying the BOX layer;
   a first circuit formed in a first silicon region of the thin silicon layer; and
   a first implant in a region of the trap-rich layer that is immediately below the first circuit,
   wherein:
   the SOI structure further comprises a second implant in a region of the trap-rich layer that surrounds the first implant, and
   an interface between the first implant and the second implant forms a first junction that is fully contained in the trap-rich layer and separated from the HR-Si substrate by an undoped region of the trap-rich layer.

2. The silicon on insulator (SOI) structure of claim 1, wherein:
   the first junction is a p-n junction.

3. The silicon on insulator (SOI) structure of claim 1, wherein:
   the first implant is formed in a well of the second implant.

4. The silicon on insulator (SOI) structure of claim 1, wherein:
   the SOI structure further comprises a first through box contact (TBC), and
   the first TBC penetrates the BOX layer at a first shallow trench isolation (STI) region to contact the first implant.

5. The silicon on insulator (SOI) structure of claim 4, wherein:
   the first TBC resistively contacts the first implant for biasing of the first implant with first voltage.

6. The silicon on insulator (SOI) structure of claim 1, wherein:
   the first implant is configured to be biased with a first voltage that is based on an operating state of the first circuit.

7. The silicon on insulator (SOI) structure of claim 1, wherein:
   the SOI structure further comprises a second through box contact (TBC), and
   the second TBC penetrates the BOX layer at a second shallow trench isolation (STI) region to contact the second implant.

8. The silicon on insulator (SOI) structure of claim 7, wherein:
   the second TBC resistively contacts the second implant for biasing of the second implant with a second voltage.

9. The silicon on insulator (SOI) structure of claim 1, wherein:
   the SOI structure further comprises
      a second circuit formed in a second silicon region of the thin silicon layer, the second silicon region isolated from the first silicon region; and
      a third implant in a region of the trap-rich layer that is immediately below the second circuit, the third implant separated from the first implant by an undoped region of the trap-rich layer.

10. The silicon on insulator (SOI) structure of claim 9, wherein:
    the third implant is fully contained in the trap-rich layer and separated from the HR-Si substrate by an undoped region of the trap-rich layer.

11. The silicon on insulator (SOI) structure of claim 9, wherein:
    the SOI structure further comprises a fourth implant in a region of the trap-rich layer that surrounds the third implant, and
    an interface between the third implant and the fourth implant forms a second junction.

12. The silicon on insulator (SOI) structure of claim 11, wherein:
    the first junction and the second junction are
       separated from one another by an undoped region of the trap-rich layer, and
       separated from the HR-Si by an undoped region of the trap-rich layer.

13. The silicon on insulator (SOI) structure of claim 12, wherein:
    the first junction and the second junction form back-to-back reversed diodes that are configured to reduce flow of charges between the first and third implants.

14. A silicon on insulator (SOI) structure, comprising:
    an RF-SOI substrate, the RF-SOI substrate comprising
       a high resistivity silicon (HR-Si) substrate;
       a trap-rich layer overlying the HR-Si substrate;
       a buried oxide (BOX) layer overlying the trap-rich layer; and
       a thin silicon layer overlying the BOX layer;
    a first circuit formed in a first silicon region of the thin silicon layer; and
    a first implant in a region of the trap-rich layer that is immediately below the first circuit,
    wherein:

the first implant is configured to be biased with a first voltage that is based on an operating state of the first circuit;

the SOI structure further comprises a second implant in a region of the trap-rich layer disposed about the first implant;

an interface between the first implant and the second implant forms a first junction; and the first junction is fully contained in the trap-rich layer and separated from the HR-Si substrate by an undoped region of the trap-rich layer.

15. A silicon on insulator (SOI) structure, comprising:
an RF-SOI substrate, the RF-SOI substrate comprising
a high resistivity silicon (HR-Si) substrate;
a trap-rich layer overlying the HR-Si substrate;
a buried oxide (BOX) layer overlying the trap-rich layer; and
a thin silicon layer overlying the BOX layer;
a first circuit formed in a first silicon region of the thin silicon layer; and
a first implant in a region of the trap-rich layer that is immediately below the first circuit,
wherein
the first implant is configured to be biased with a first voltage that is based on an operating state of the first circuit,
the SOI structure further comprises
a second implant in a region of the trap-rich layer that surrounds the first implant;
a second circuit formed in a second silicon region of the thin silicon layer, the second silicon region isolated from the first silicon region; and
a third implant in a region of the trap-rich layer that is immediately below the second circuit, the third implant separated from the first implant by an undoped region of the trap-rich layer,
the third implant is configured to be biased with a third voltage that is based on an operating state of the second circuit, the SOI structure further comprises a fourth implant in a region of the trap-rich layer that surrounds the third implant,
an interface between the first implant and the second implant forms a first junction, and
an interface between the third implant and the fourth implant forms a second junction.

16. The silicon on insulator (SOI) structure of claim 15, wherein:
the first junction and the second junction are
separated from one another by an undoped region of the trap-rich layer, and
separated from the HR-Si by an undoped region of the trap-rich layer.

17. The silicon on insulator (SOI) structure of claim 15, wherein:
the first junction and the second junction form back-to-back reversed diodes that are configured to reduce flow of charges between the first and third implants.

18. A silicon on insulator (SOI) structure, comprising:
an RF-SOI substrate comprising a high resistivity silicon (HR-Si) substrate, a trap-rich layer overlying the HR-Si substrate, a buried oxide (BOX) layer overlying the trap-rich layer, a thin silicon layer overlying the BOX layer, and a first circuit formed in a first silicon region of the thin silicon layer;
the SOI structure further comprising a first implant disposed in a region of the trap-rich layer immediately below the first circuit and a second implant disposed in a region of the trap-rich layer extending around the first implant;
wherein an interface between the first implant and the second implant forms a first junction that is fully contained in the trap-rich layer and separated from the HR-Si substrate by an undoped region of the trap-rich layer.

19. The silicon on insulator (SOI) structure of claim 18, wherein:
the first implant is configured to be biased with a first voltage that is based on an operating state of the first circuit.

* * * * *